US012607933B2

(12) United States Patent
Zhang et al.

(10) Patent No.: US 12,607,933 B2
(45) Date of Patent: Apr. 21, 2026

(54) POLYMER COMPOSITIONS HAVING PHOTOACID GENERATORS AND PHOTORESISTS

(71) Applicant: DuPont Electronics, Inc., Wilmington, DE (US)

(72) Inventors: Yongqiang Zhang, Dayton, OH (US); Qiu Dai, Centerville, OH (US); Michael Thomas Sheehan, Liberty Hill, TX (US); Murali Ganth Theivanayagam, Dayton, OH (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 702 days.

(21) Appl. No.: 17/970,130

(22) Filed: Oct. 20, 2022

(65) Prior Publication Data

US 2024/0192595 A1 Jun. 13, 2024

(51) Int. Cl.
*G03F 7/039* (2006.01)
*C08F 220/18* (2006.01)
*C08L 33/10* (2006.01)

(52) U.S. Cl.
CPC ........ *G03F 7/039* (2013.01); *C08F 220/1806* (2020.02); *C08L 33/10* (2013.01); *G03F 7/0392* (2013.01); *G03F 7/0395* (2013.01); *G03F 7/0397* (2013.01)

(58) Field of Classification Search
CPC ...... G03F 7/039; G03F 7/0392; G03F 7/0395; G03F 7/0397; C08F 220/1806; C08L 33/10
See application file for complete search history.

(56) References Cited

U.S. PATENT DOCUMENTS

| | | | | |
|---|---|---|---|---|
| 5,087,772 | A | 2/1992 | Sheehan et al. | |
| 6,414,110 | B1 | 7/2002 | Sheehan et al. | |
| 6,593,431 | B2 | 7/2003 | Sheehan et al. | |
| 6,759,483 | B2 | 7/2004 | Sheehan et al. | |
| 6,787,661 | B2 | 9/2004 | Li et al. | |
| 6,864,324 | B2 | 3/2005 | Sheehan et al. | |
| 7,148,320 | B2 | 12/2006 | Sheehan et al. | |
| 7,312,281 | B2 | 12/2007 | Sheehan et al. | |
| 8,048,610 | B2 * | 11/2011 | Ohsawa | G03F 7/0397 430/326 |
| 10,377,842 | B2 | 8/2019 | Hatakeyama et al. | |
| 2014/0212797 | A1 * | 7/2014 | Kawabata | C08F 28/02 526/287 |

OTHER PUBLICATIONS

M. Thiyagarajan et al., "Improved Lithographic Performance for EUV Resists Based on Polymer having a Photoacid Generator (PAG) in the Backbone," J. Photopolym. Sci. Technol., vol. 18, No. 6, 2005.

* cited by examiner

*Primary Examiner* — Mark F. Huff

(57) ABSTRACT

In a first aspect, a polymer composition includes 0.5 to 99 mol % of a hydroxystyrene repeat unit, 0.5 to 99 mol % of a sulfonated photoacid generator repeat unit and 0.5 to 99 mol % of an acid labile repeat unit. In a second aspect, a photoresist composition includes the polymer composition of the first aspect.

8 Claims, No Drawings

POLYMER COMPOSITIONS HAVING PHOTOACID GENERATORS AND PHOTORESISTS

FIELD OF DISCLOSURE

The field of this disclosure is polymer compositions having photoacid generators and photoresists.

BACKGROUND OF THE DISCLOSURE

Chemically amplified resists (CARs), widely used for integrated circuit manufacturing in the semiconductor industry, mainly consist of photoacid generators (PAGs) and polymers. When the photoresists are subjected to photoexposure, the acids generated from the PAGs will trigger a catalytic reaction to enable the polymers in the exposure region to become more soluble in an aqueous basic solution developer. Thus, a silicon substrate can be patterned to form integrated circuits with desired features. Conventional polymer blended photoresists work well for chip manufacturing with higher technology nodes (i.e., larger critical dimensions, such as for ArF and KrF processes), but as feature sizes continue to shrink, newer technologies are needed to manufacture integrated circuits with lower technology nodes (smaller critical dimensions, such as 10 nm or less), while maintaining good lithographic performance (e.g., high resolution, low line-width roughness (LWR) or line-edge roughness (LER), and high sensitivity). Manufacturers are turning to extreme ultra-violet (EUV) photoresists to address these needs.

In conventional polymer-blended photoresists, ionic PAGs can readily form micro-aggregates in the polymer matrix. The formation of these aggregates leads to nonuniformity of the photoresists, thereby causing the formation of defects and high LWR upon patterning and many other problems. In PAG-bound polymers, the PAG molecules covalently bonded to the polymer backbone are more uniformly distributed in the polymer matrix and can further improve lithographic performance (see, e.g., M. Thiyagarajan et al., "Improved Lithographic Performance for EUV Resists Based on Polymer having a Photoacid Generator (PAG) in the Backbone," *J. Photopolym. Sci. Technol.*, Vol. 18, No. 6, 2005). The polymer backbone inhibits the formation of micro-aggregates of the PAG moiety. Hence, PAG-bound polymers are well suited for a new generation of EUV photoresists.

DETAILED DESCRIPTION

In a first aspect, a polymer composition includes:

0.5 to 99 mol % of a hydroxystyrene repeat unit having the formula (A):

(A)

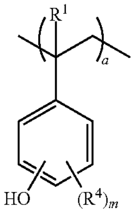

0.5 to 99 mol % of a sulfonated photoacid generator repeat unit having the formula (B):

(B)

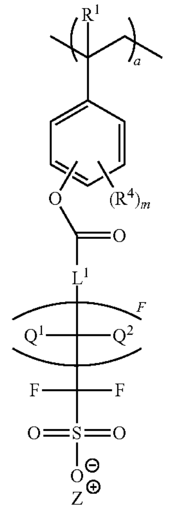

and 0.5 to 99 mol % of an acid labile repeat unit having the formula (C):

(C)

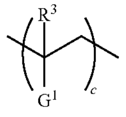

wherein:

each of $R^1$, $R^2$, and $R^3$ independently represents a hydrogen atom, an alkyl group, a cycloalkyl group, a halogen atom, a cyano group or an alkoxycarbonyl group;

$R^4$ represents a hydrogen atom, an alkyl group, an alkoxy group, a halogen atom, or a cyano group, and m represents an integer in a range of from to 4, wherein when m is 2 or more, each $R^4$ independently represents a hydrogen atom, an alkyl group, an alkoxy group, a halogen atom, or a cyano group;

each of $Q^1$ and $Q^2$ independently represents a hydrogen atom, a fluorine atom or a perfluoro alkyl group with 1 to 4 carbon atoms, and n represents an integer in a range of from 0 to 4, wherein when n is 2 or more, each $Q^1$ and $Q^2$ independently represents a hydrogen atom, a fluorine atom or a perfluoro alkyl group with 1 to 4 carbon atoms;

$L^1$ represents a single bond or a divalent saturated hydrocarbon group having from 1 to 20 carbon atoms, wherein one or more methylene groups in the divalent saturated hydrocarbon group is replaced by an oxygen, a sulfur, a carbonyl group, or a sulfonyl group;

$Z^+$ represents an organic cation; and $G^1$ represents an organic group including an acid labile group.

In a second aspect, a photoresist composition includes the polymer composition of the first aspect.

Although methods and materials similar or equivalent to those described herein can be used in the practice or testing of the present invention, suitable methods and materials are described herein.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In describing certain polymers, it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers or that amount of the monomers, and the corresponding polymers and compositions thereof.

The materials, methods, and examples herein are illustrative only and, except as specifically stated, are not intended to be limiting.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

It will be understood that although the terms first, second, third, etc. may be used herein to describe various elements, components, regions, layers and/or sections, these elements, components, regions, layers, and/or sections should not be limited by these terms. These terms are only used to distinguish one element, component, region, layer and/or section from another element, component, region, layer and/or section. Thus, a first element, component, region, layer and/or section could be termed a second element, component, region, layer and/or section without departing from the teachings of the present invention. Similarly, the terms "top" and "bottom" are only relative to each other. It will be appreciated that when an element, component, layer or the like is inverted, what is the "bottom" before being inverted would be the "top" after being inverted, and vice versa. When an element is referred to as being "on" or "disposed on" another element, it means positioning on or below the object portion, but does not essentially mean positioning on the upper side of the object portion based on a gravity direction, and it can be directly on the other element or intervening elements may be present therebetween. In contrast, when an element is referred to as being "directly on" or "disposed directly on" another element, there are no intervening elements present.

Further, it will also be understood that when one element, component, region, layer and/or section is referred to as being "between" two elements, components, regions, layers and/or sections, it can be the only element, component, region, layer and/or section between the two elements, components, regions, layers and/or sections, or one or more intervening elements, components, regions, layers and/or sections may also be present.

Hydroxystyrene Repeat Unit

In one embodiment, a hydroxystyrene repeat unit has the formula (A):

(A)

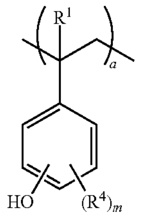

wherein:

$R^1$ represents a hydrogen atom, an alkyl group, a cycloalkyl group, a halogen atom, a cyano group or an alkoxycarbonyl group;

$R^4$ represents a hydrogen atom, an alkyl group, an alkoxy group, a halogen atom, or a cyano group; m represents an integer in a range of from 1 to 4, wherein when m is 2 or more, each $R^4$ independently represents a hydrogen atom, an alkyl group, an alkoxy group, a halogen atom, or a cyano group; and a is in a range of from 0.5 to 99 mol %.

In one embodiment, an alkyl group for $R^1$ and $R^4$ can each individually be linear or branched and have from 1 to 8 carbons, such as a methyl group, an ethyl group, a propyl group, a butyl group, a hexyl group and an octyl group. In a specific embodiment, an alkyl group can be a methyl group, an isopropyl group or a tert-butyl group.

In one embodiment, a cycloalkyl group for $R^1$ can be a monovalent cycloalkyl group having from 3 to 10 carbons, such as a cyclobutyl group, a cyclopentyl group and a cyclohexyl group. In a specific embodiment, a cycloalkyl group can be a cyclopentyl group or a cyclohexyl group, In one embodiment, an alkoxycarbonyl group for $R^1$ can be linear or branched and have from 2 to 11 carbons, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, and an n-decyloxycarbonyl group. In a specific embodiment, an alkoxycarbonyl group can be a methoxycarbonyl group, an ethoxycarbonyl group or an n-butoxycarbonyl group.

In one embodiment, an alkoxy group for $R^4$ can be linear or branched and have from 2 to 11 carbons, such as a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group, and an n-decyloxy group. In a specific embodiment, an alkoxy group can be a methoxy group, an ethoxy group or an n-butoxy group.

In one embodiment, the hydroxystyrene repeat unit can be derived from 4-hydroxystyrene (HSM), 3-methyl-4-hydroxystyrene or α-methyl-4-hydroxystyrene.

In one embodiment, a 4-hydroxystyrene monomer can be prepared from 4-acetoxystyrene monomer (ASM). U.S. Pat. Nos. 5,087,772, 6,759,483 B2, 6,864,324 B2 and 7,312,281 B2 describe useful methods for producing hydroxystyrene monomers and copolymers containing hydroxystyrene and are incorporated by reference in their entirety. U.S. Pat. Nos. 6,414,110 B1, 6,593,431 B2, 6,787,661 B2 and 7,148,320 B2 describe useful methods for further purifying hydroxystyrene monomers and are incorporated by reference in their entirety.

Photoacid Generator Repeat Unit

In one embodiment, a sulfonated photoacid generator repeat unit has the formula (B):

(B)

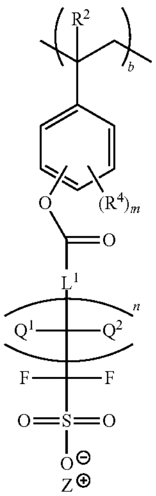

wherein, $R^2$ represents a hydrogen atom, an alkyl group, a cycloalkyl group, a halogen atom, a cyano group or an alkoxycarbonyl group;

$R^4$ is the same as described above for $R^4$ of the hydroxystyrene repeat unit;

each of $Q^1$ and $Q^2$ independently represents a hydrogen atom, a fluorine atom or a perfluoro alkyl group with 1 to 4 carbon atoms, and n represents an integer in a range of from 0 to 4, wherein when n is 2 or more, each $Q^1$ and $Q^2$ independently represents a hydrogen atom, a fluorine atom or a perfluoro alkyl group with 1 to 4 carbon atoms;

$L^1$ represents a single bond or a divalent saturated hydrocarbon group having from 1 to 20 carbon atoms, wherein one or more methylene groups in the divalent saturated hydrocarbon group is replaced by an oxygen, a sulfur, a carbonyl group, or a sulfonyl group;

$Z^+$ represents an organic cation; and b is in a range of from 0.5 to 99 mol %.

In one embodiment, an alkyl group for $R^2$ can be any of the groups described above for $R^1$ and $R^4$ of the hydroxystyrene repeat unit.

In one embodiment, a cycloalkyl group or an alkoxycarbonyl group for $R^2$ can be any of the groups described above for $R^1$ of the hydroxystyrene repeat unit.

In one embodiment, the organic cation can include a sulfonium cation or an iodonium cation.

In one embodiment, a sulfonium cation can include:

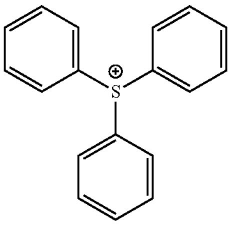

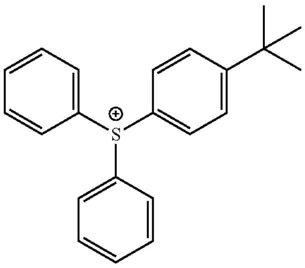

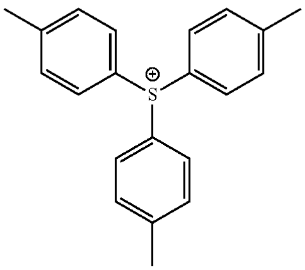

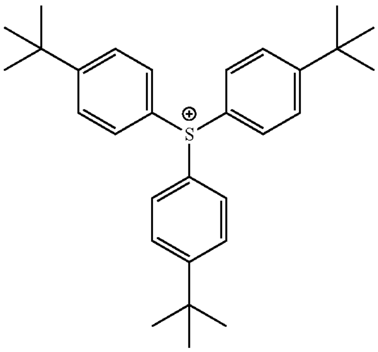

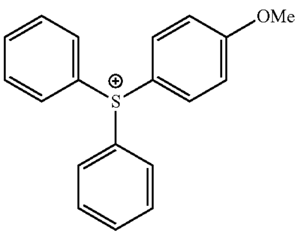

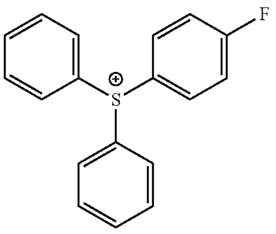

-continued
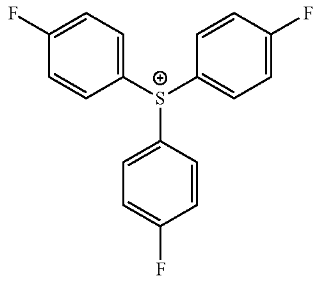
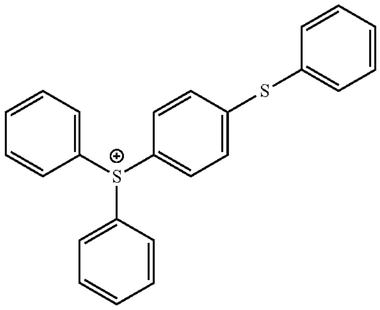
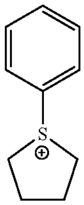
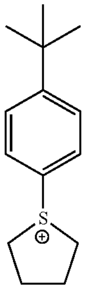
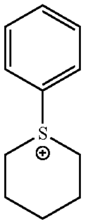
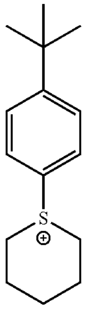
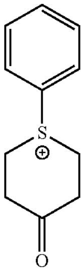
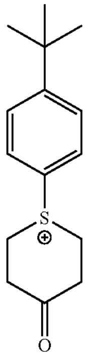
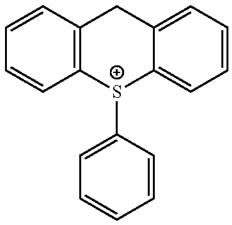
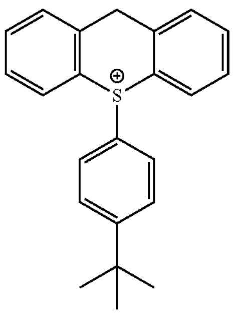
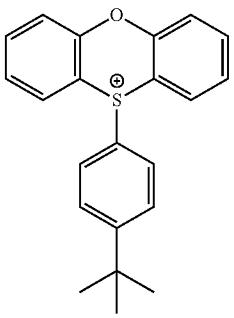
-continued
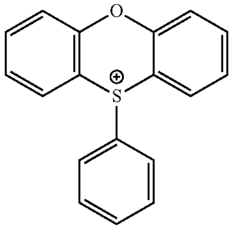
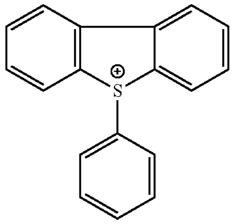
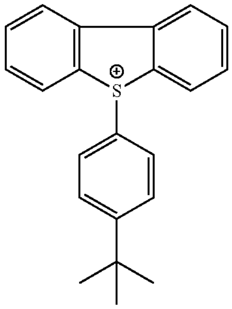
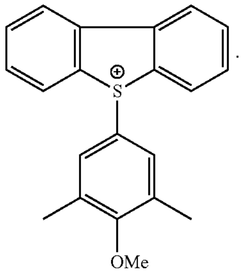
In one embodiment, an iodonium cation can include:
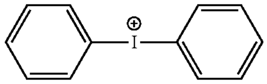
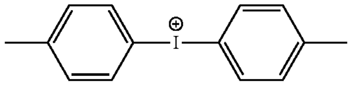
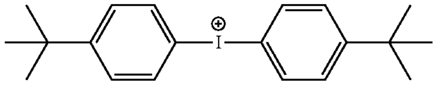
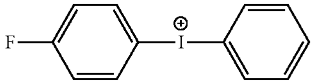
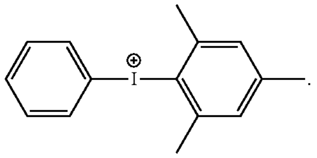
In one embodiment, the sulfonated photoacid generator repeat unit having the formula (B) is given by:
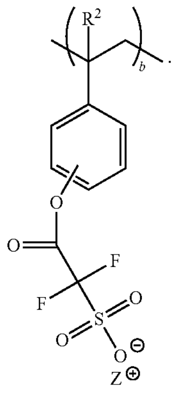

In a specific embodiment, the sulfonated photoacid generator repeat unit having the formula (B) is given by:

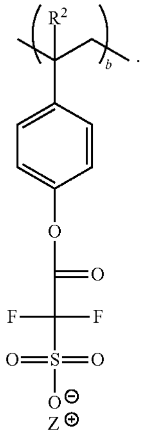

In a more specific embodiment, the sulfonated photoacid generator repeat unit having the formula (B) is given by:

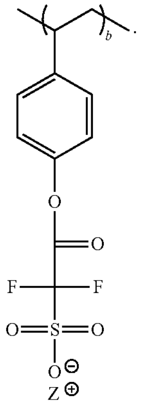

Monomers with Acid Labile Groups

In one embodiment, an acid labile repeat unit has the formula (C):

(C)

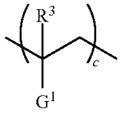

wherein, $R^3$ represents a hydrogen atom, an alkyl group, a cycloalkyl group, a halogen atom, a cyano group or an alkoxycarbonyl group.

$G^1$ represents an organic group comprising an acid labile group.

In one embodiment, an alkyl group, a cycloalkyl group or an alkoxycarbonyl group for $R^3$ can be any of the groups described above for $R^1$ of the hydroxystyrene repeat unit.

In one embodiment, an acid labile group for $G^1$ can be a tertiary carbon functional group with the tertiary carbon atom directly bonded to an oxygen atom, or an acetal functional group. In one embodiment, an acid labile repeat unit (C) can be derived from an acrylate monomer having an acid-labile group in its side chain or a methacrylate monomer having an acid-labile group in its side chain. Examples of acrylate and methacrylate monomers having an acid-labile group can include:

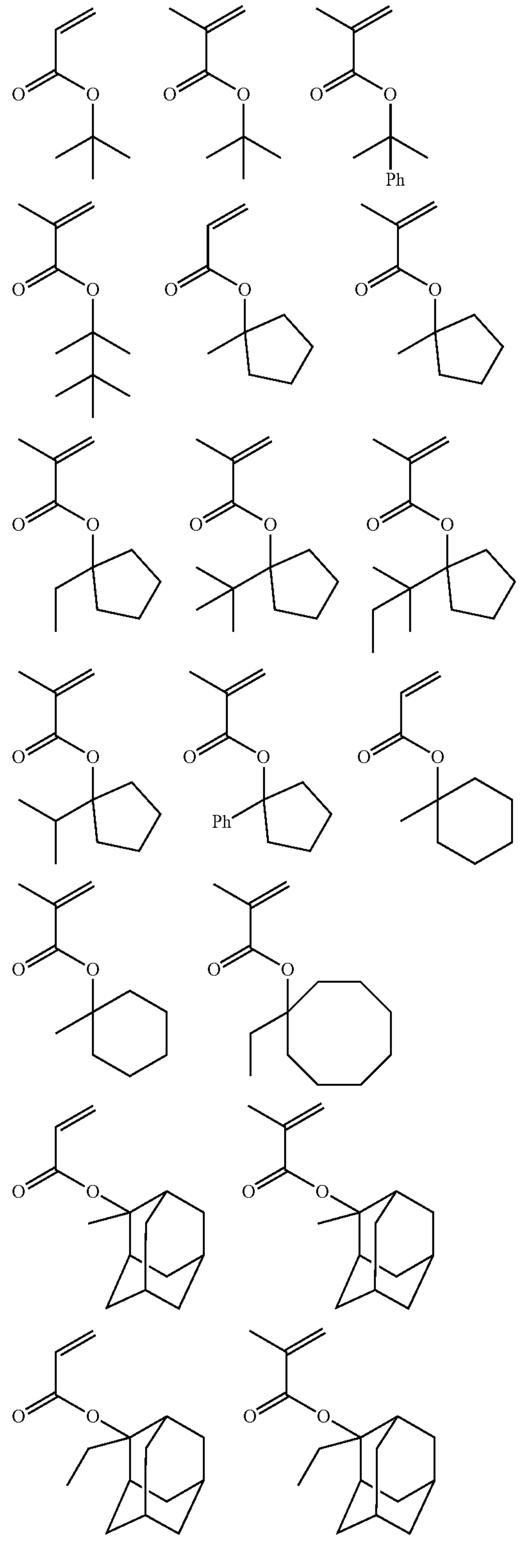

-continued

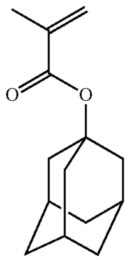

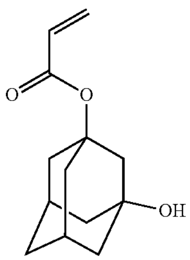

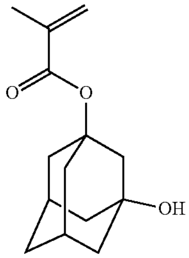

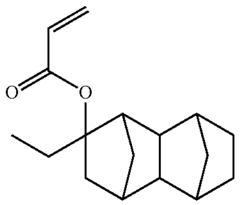

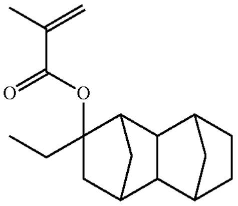

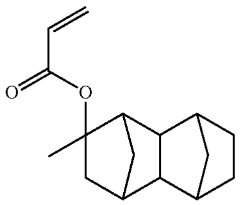

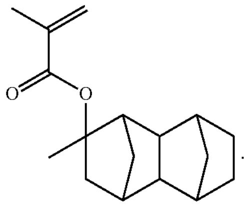

In one embodiment, the acid labile repeat unit having the formula (C) can be derived from hydroxystyrene derivative monomers and can include:

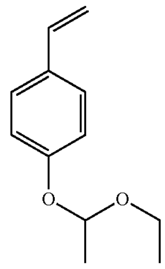

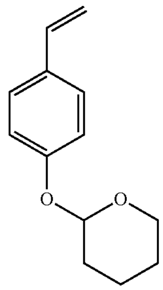

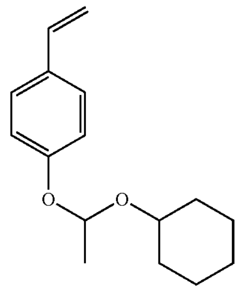

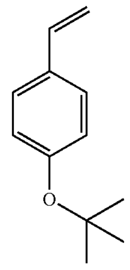

-continued

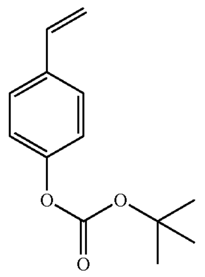

Those skilled in the art understand that an acid labile repeat unit in a polymer composition can be derived from a broad range of monomers having an acid labile group.

Additional Monomers

In one embodiment, an additional repeat unit not containing an acid labile group has the formula (D):

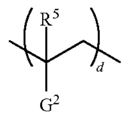

(D)

wherein:

$R^5$ represents a hydrogen atom, an alkyl group, a cycloalkyl group, a halogen atom, a cyano group or an alkoxycarbonyl group; and $G^2$ represents an organic group not containing an acid labile group.

In one embodiment, an alkyl group, a cycloalkyl group or an alkoxycarbonyl group for $R^5$ can be any of the groups described above for $R^1$ and $R^4$ of the hydroxystyrene repeat unit, In one embodiment, the additional repeat unit not containing an acid labile group having the formula (D) can be derived from an acrylate monomer or a methacrylate monomer, including:

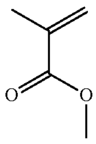

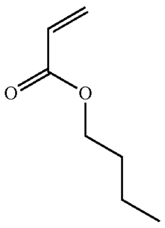

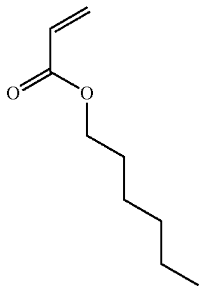

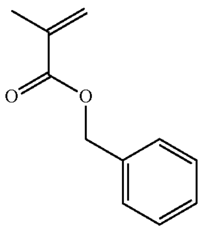

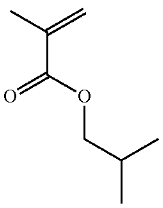

-continued

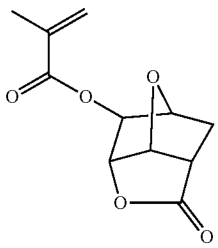

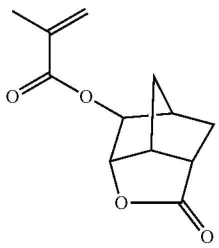

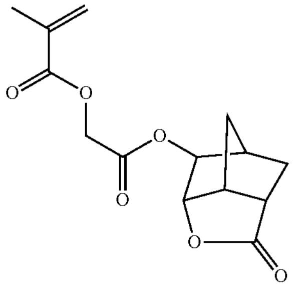

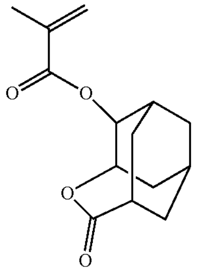

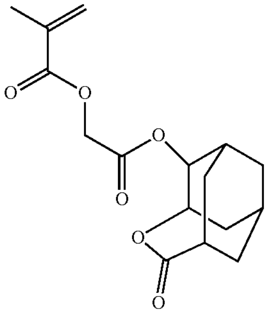

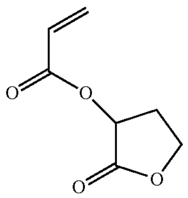

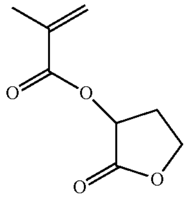

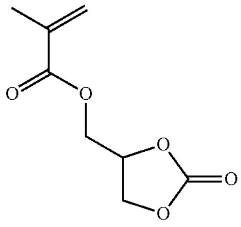

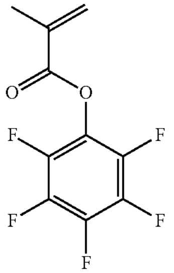

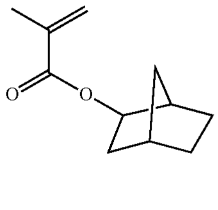

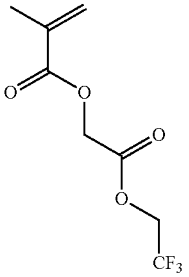

-continued

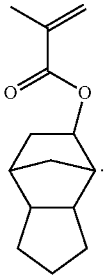

In one embodiment, the additional repeat unit not containing an acid labile group having the formula (D) can be derived from a styrene monomer, including:

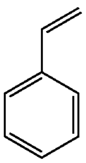

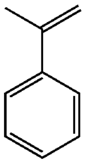

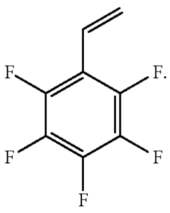

Those skilled in the art understand that when including an additional repeat unit not containing an acid labile group in a polymer composition, the additional repeat unit may be derived from a broad range of monomers, Polymer Compositions Typically, synthesis of PAG-bound polymers involves direct co-polymerization of PAG monomers and other monomers using radical-initiated polymerization reactions. To produce high-quality and pure PHS-containing PAG-bound polymers, hydroxystyrene including a protection group such as acetyl or tert-butyl at phenol hydroxy is used for co-polymerization, followed by an acid- or base-catalyzed deprotection reaction to generate PHS-containing PAG-bound polymers. Since the PAG-bound polymer contains both acid and base labile groups in its structure, the acid- or base-catalyzed deprotection reaction will lead to the degradation of these acid and base labile groups. Hence, the desired PAG-bound polymers can be very difficult to produce using a co-polymerization/deprotection synthetic approach.

Polymer compositions of this invention can be synthesized by either chain-growth polymerization between a PAG monomer with other monomers or functionalization of a copolymer or terpolymer. In one embodiment, the functionalization of a copolymer or terpolymer is used to generate a PAG-bound polymer with more uniformly distributed PAG moieties.

The functionalization of PHS-containing base copolymers or terpolymers with a PAG monomer in this invention overcomes the challenges of direct co-polymerization and makes the synthesis of the PHS-containing PAG-bound polymers commercially viable. Furthermore, the polymer functionalization approach can generate a more uniform PAG-bound polymer in which PAG moieties are more uniformly distributed along the polymer backbone than would be found using a traditional direct co-polymerization approach. PAG monomers including a bulky PAG moiety react much more slowly than other small monomers in co-polymerization reactions, leading to a less uniform distribution of PAG moieties in the final PAG-bound polymer (i.e., a much smaller number of PAG monomers are incorporated into the polymer chains formed in the beginning of co-polymerization, and a much larger number of PAG monomers are incorporated into the polymer chains formed at the end of co-polymerization). A PAG-bound polymer with more uniformly distributed PAG moieties in the polymer backbone may have better lithographic performance, such as smaller line width roughness (LWR) and line edge roughness (LER).

In one embodiment, a polymer composition can be synthesized by chain-growth polymerization in which the growth of the polymer chain proceeds exclusively by reactions between monomers and active sites on the polymer chain with regeneration of the active sites at the end of each growth step. An initiator is required to react with the monomers to induce the initiation of polymerization. The initiator can be a free radical, cation, anion or organometallic complex by either itself or a stable precursor which can generate the above reactive species by thermal decomposition or other chemical reactions. In one embodiment, radical-initiated chain-growth polymerization is used. For example, a typical base polymer, PHS-MCPMA can be prepared by the co-polymerization of acetoxystyrene monomer (ASM) and methylcyclopentyl methacrylate (MCPMA) monomer, followed by the base-catalyzed methanolysis deprotection of the acetyl group (as described in U.S. Pat. No. 6,759,483 B2) and shown in Scheme 1.

Scheme 1

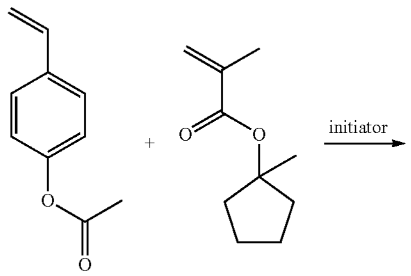

-continued

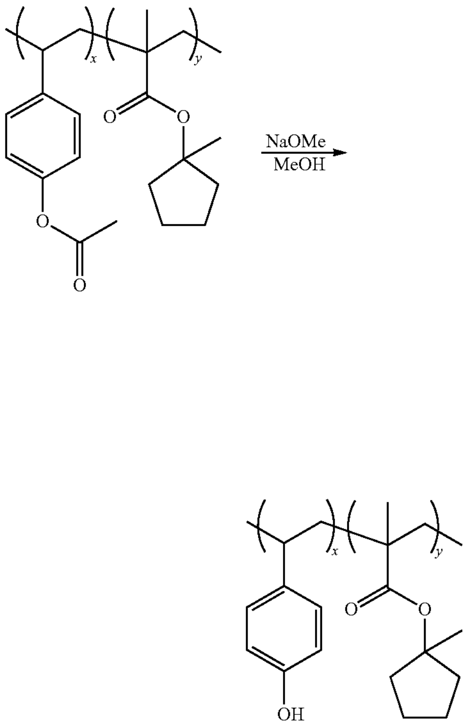

In one embodiment, a PAG-bound polymer can be synthesized starting from the PAG monomer sulfonium, triphenyl-2,2-difluoro-2-sulfoacetate (1:1), CAS No. 942619-42-3 and the PHS-MCPMA of Scheme 1 using radical-initiated chain-growth polymerization as shown in Scheme 2.

Scheme 2

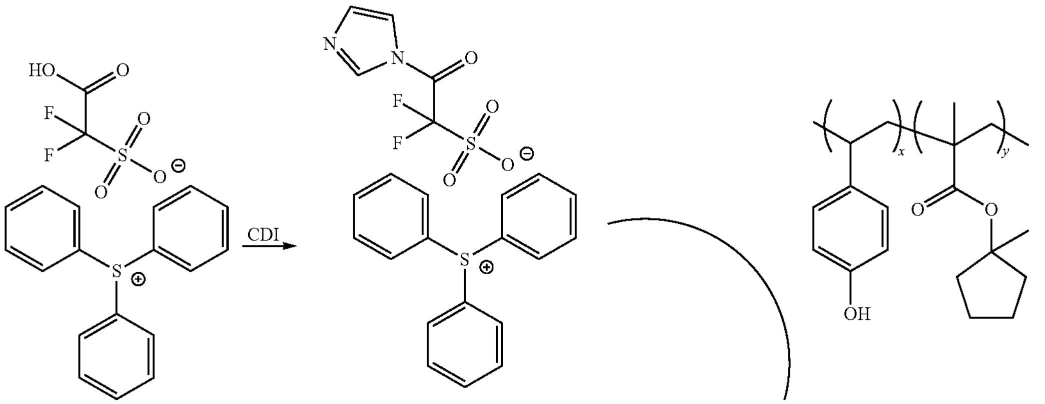

-continued

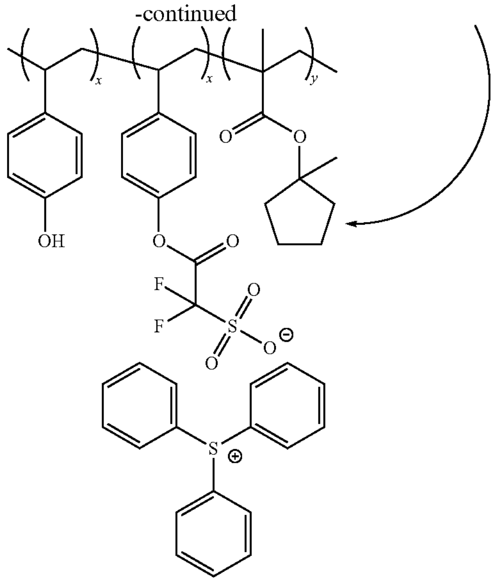

In one embodiment, a polymer composition can be a predominantly random copolymer or terpolymer. In some embodiments, random copolymers and terpolymers can produce PAG-bound polymers with more uniformly distributed PAG moieties in their backbones via polymer functionalization reactions with PAG monomers.

In one embodiment, a PAG-bound polymer composition includes three or four different repeating units. A hydroxystyrene repeating unit (A) can improve adhesion to a substrate, etch resistance, and EUV transparency. In some embodiments, a sulfonated photoacid generator repeat unit (B) can improve the lithographic performance of a KrF or an EUV photoresist, such as by decreasing LER, decreasing LWR, lowering outgassing, improving acid uniformity or increasing photospeed. An acid labile repeat unit (C) can provide a dissolution switch resulting from polarity change via acid-catalyzed deprotection reactions. In one embodiment, a sulfonated photoacid generator repeat unit (B) can generate acid to catalyze deprotection reactions in an acid labile repeating unit (C). In order for the PAG bound polymer to be more suitable for photoresist application, a repeat unit (D) not having an acid labile group can sometimes be incorporated to improve adhesion to a substrate, change hydrophilicity or hydrophobicity, increase photosensitization, and improve etch resistance.

Photoresist Compositions

In one embodiment, a photoresist composition including a PAG-bound polymer composition as a base resin is positive working and is especially useful as a chemically amplified positive photoresist composition. Specifically, the chemically amplified positive photoresist composition can include a PAG-bound polymer composition, a quencher and an organic solvent. In one embodiment, the quencher can be an organic basic compound. Such basic compounds include primary, secondary, and tertiary aliphatic amines, mixed aliphatic amines including primary, secondary and tertiary amines, aromatic amines, heterocyclic amines, nitrogen-containing compounds with a variety of functional groups such as hydroxy groups, carbonyl groups, sulfonyl groups, ether groups, ester groups, lactone groups, carboxylic acid groups, or cyano groups. Other examples of basic compounds include amide derivatives, imide derivatives and carbamate derivatives. Using a basic compound may help suppress the diffusion rate of the formed photo acid in the resist film and improve the pattern profile. In one embodiment, the quencher may be an onium salt, such as a sulfonium salt, an iodonium salt or an ammonium salt of a sulfonic acid without fluorine substituents at the α-carbon position or a similar onium salt of a carboxylic acid. α-fluorinated sulfonic acids, imide acids and methide acids are organic superacids which can deprotect the acid labile group of a carboxylic acid ester. However, in the presence of an ionium salt of an α-non-fluorinated sulfonic acid and a carboxylic acid, these organic superacids generated by photochemical reactions in the lithography process are quenched by an exchange reaction between the superacids and the α-non-fluorinated onium salt. Hence, an ionium salt of an α-non-fluorinated sulfonic acid and a carboxylic acid function as a quencher which can exert an acid diffusion controlling effect by suppressing the diffusion rate of the generated photo acid in the resist film and thereby improve the pattern profile. In one embodiment, the quencher is present in an amount of up to 5 parts, or up to 2 parts by weight per 100 parts by weight of the PAG-bound polymer composition. The quencher may be used alone or in admixture.

In one embodiment, an organic solvent may be used to formulate a chemically amplified positive photoresist composition. The organic solvent is typically used to dissolve the photoresist components so that the photoresist is suitable for dispensing and coating. The organic solvent used is not particularly limited as long as the PAG-bound polymer compositions, quenchers and other additives are soluble therein. Exemplary organic solvents include anisole; alcohols including 3-methoxybutanol, 3-methoxy-3-methyl-1-butanol and diacetone alcohol (DAA); ketones including cyclohexanone, cyclopentanone and 2-heptanone; ethers including propylene glycol monomethyl ether (PGME), propylene glycol monoethyl ether and ethylene glycol monoethyl ether; esters including propylene glycol monomethyl ether acetate (PGMEA), propylene glycol monoethyl ether acetate, ethyl lactate (EL), butyl acetate and methyl 3-methoxypropionate; and lactones such as γ-butyrolactone (GBL). The organic solvent may be used alone or in admixture. In one embodiment, the organic solvent is present in a range of from 100 to 20,000 parts, or from 200 to 10,000 parts by weight per 100 parts by weight of the PAG-bound polymer.

In some embodiments, additional components, or additives, are used to enhance the performance of the photoresist. In one embodiment, additives include surfactants, dissolution inhibitors, and water repellency improvers. In one embodiment, an additive is present in a range of from 0 to 20 parts, or from 0.5 to 10 parts by weight per 100 parts by weight of the PAG-bound polymer. The additive may be used alone or blended in any desired combination to formulate a chemically amplified positive photoresist composition.

In one embodiment, a photoresist composition including a PAG-bound polymer composition is a chemically amplified negative resist composition.

In one embodiment, a photoresist composition including a PAG-bound polymer composition can be an EUV photoresist. In one embodiment, a photoresist composition including a PAG-bound polymer composition can be a KrF photoresist.

In one embodiment, a photoresist composition including a PAG-bound polymer composition as a base resin has PAG moieties more uniformly distributed in the photoresist matrix compared to a photoresist composition having a PAG-blend polymer composition. The PAG-bound composition can help decrease LER and LWR, limit PAG outgassing, and increase photospeed.

The advantageous properties of this invention can be observed by reference to the following examples that illustrate, but do not limit, the invention. All parts and percentages are by weight unless otherwise indicated.

EXAMPLES

Test Methods

Polymer Characterization

Polymer compositions (both PHS-containing base copolymers and PAG-bound polymers) were characterized using quantitative $^{13}C$ and/or $^{19}F$ NMR on a 400 MHz NMR spectrometer (Bruker Ascend™ 400, Bruker Corp., Billerica, MA). To obtain more accurate integration for different carbon signals, $^{13}C$ spectra were acquired using inverse-gated decoupling (IGD) pulse sequences (pulse zgig). Upon preparing an NMR sample, a relaxation reagent, $Cr(acac)_3$, was also used to minimize unwanted nuclear Overhauser effect (NOE) and longitudinal relaxation times (T1) so that the integration of carbon signals was more accurate, and the spectral acquisition time was shorter. The polymer composition was obtained by comparing the relative integration number of carbon signals from different repeating units. $^{19}F$ spectra were acquired using zg30 pulse sequence. Since $^{19}F$ NMR is much more sensitive than $^{13}C$ NMR, $^{19}F$ NMR was also used to monitor reactions and processes besides the characterization of the fluorine-containing polymer structures. The mass molecular weight ($M_w$) and polydispersity (PD, $M_w/M_n$) of all the polymers were obtained on a GPC instrument (ACQUITY™ Advanced Polymer Chromatography™ System, Waters Corp., Milford, MA) equipped with a photodiode array (PDA) and refractive index (RI) detector. The mobile phase and flow rate were DMAc with 40 mM LiCl and 0.5 mL/min, respectively. The columns utilized were two PLgel 5 μm Mixed-D 300×7.5 mm columns in series with a guard column. Samples were dissolved in DMAc with 100 mM LiCl, and the instrument was calibrated with APC PMMA mid-MW range standards. The detector used for MW calculation was the RI detector.

Polymer 1

For Polymer 1 (P1), a polymer derived from 4-hydroxystyrene monomer (HSM), sulfonated photoacid generator (PAG) monomer PAG1 and acid labile monomer methylcyclopentyl methacrylate (MCPMA) was synthesized. In a 100 ml flask was added 6.14 g of sulfonium, triphenyl-2,2-difluoro-2-sulfoacetate (1:1), CAS No. 942619-42-3 (PAG1), 30 g of chloroform, followed by slow addition of 2.30 g of 1,1'-carbonyldi(1H-imidazole), CAS No. 530-62-1 (CDI, SynQuest Labs, Inc.). The mixture was stirred at 60±2° C. for 2 hr in a heat bath. The flask was removed from the heat bath, and the solution was allowed to cool to room temperature.

In a 300 ml flask was added 20 g of PHS-MCPMA and 20 g of THF. The mixture was stirred at ambient temperature for 2 h to form a clear viscous solution. The solution was cooled to 2-4° C. using an ice-water bath. To this solution the above PAG-containing solution was added dropwise over 5 min. The cold bath was removed, and the mixed solution was allowed to warm up to room temperature. The solution was then stirred at ambient temperature for 18 h. The polymer was precipitated twice in a mixture of heptane and deionized water. The polymer was filtered and dried in a high-vacuum oven at 50° C. for 24 h to give 18.4 g (yield: 90%) of the PAG bound polymer (P1). The ratio of each repeating unit (hydroxystyrene (A), sulfonated PAG (B), and acid labile (C)) was determined to be 37.2:3.3:59.5 by quantitative $^{13}C$ NMR. GPC analysis using DMAc as a mobile phase found that the weight average molecular weight ($M_w$) was 19,600, and the polydispersity (PD, $M_w/M_n$) was 1.33.

Polymers 2 to 16

Polymers 2 to 16 (P2 to P16) were similarly synthesized using the same approach as P1 and using the same hydroxystyrene and sulfonated PAG (PAG1) but changing the amount of each and changing the amount and type of acid labile monomer. In addition, the synthesis of polymers P9 and P16 include an additional monomer not containing an acid labile group. The compositions (in molar ratio), weight average molecular weight ($M_w$) and polydispersity (PD, $M_w/M_n$) of P1 to P16 are shown in Table 1. The repeating units are described using their corresponding isomeric monomers. HSM refers to 4-hydroxystyrene monomer, MCPMA refers to methylcyclopentyl methacrylate, TBA refers to tert-butyl acrylate, STY refers to styrene, EAMA refers to 2-ethyl-2-adamantyl methacrylate, TBMA refers to tert-butyl methacrylate and BzMA refers to benzyl methacrylate.

TABLE 1

| Polymer | Unit A (mol %) | Unit B (mol %) | Unit C (mol %) | Unit D (mol %) | $M_w$ | PD ($M_w/M_n$) |
|---|---|---|---|---|---|---|
| P1 | HSM (37.2) | PAG1 (3.3) | MCPMA (59.5) | — | 19,600 | 1.33 |
| P2 | HSM (34.3) | PAG1 (6.5) | MCPMA (59.2) | — | 20,500 | 1.34 |

TABLE 1-continued

| Polymer | Unit A (mol %) | Unit B (mol %) | Unit C (mol %) | Unit D (mol %) | $M_w$ | PD ($M_w/M_n$) |
|---|---|---|---|---|---|---|
| P3 | HSM (34.1) | PAG1 (8.7) | MCPMA (57.2) | — | 21,000 | 1.26 |
| P4 | HSM (37.3) | PAG1 (2.9) | MCPMA (59.8) | — | 19,200 | 1.32 |
| P5 | HSM (33.3) | PAG1 (8.6) | MCPMA (58.1) | — | 21,000 | 1.30 |
| P6 | HSM (35.6) | PAG1 (4.2) | MCPMA (60.2) | — | 19,900 | 1.33 |
| P7 | HSM (12.6) | PAG1 (27.7) | MCPMA (59.7) | — | 23,000 | 1.50 |
| P8 | HSM (26.9) | PAG1 (12.9) | MCPMA (60.2) | — | 19,600 | 1.47 |
| P9 | HSM (53.4) | PAG1 (6.8) | TBA (15.3) | STY (24.5) | 19,800 | 1.56 |
| P10 | HSM (53.4) | PAG1 (15.9) | EAMA (30.7) | — | 21,100 | 1.51 |
| P11 | HSM (32.3) | PAG1 (16.0) | MCPMA (51.7) | — | 17,900 | 1.24 |
| P12 | HSM (36.4) | PAG1 (11.4) | MCPMA (52.2) | — | 17,600 | 1.23 |
| P13 | HSM (41.1) | PAG1 (6.1) | MCPMA (52.8) | — | 16,000 | 1.27 |
| P14 | HSM (44.8) | PAG1 (3.5) | MCPMA (51.7) | — | 15,200 | 1.26 |
| P15 | HSM (35.8) | PAG1 (12.9) | MCPMA (51.3) | — | 17,800 | 1.23 |
| P16 | HSM (15.6) | PAG1 (44.4) | TBMA (29.9) | BzMA (10.1) | 55,200 | 1.31 |

Photoresists 1 to 4

For photoresists 1 to 4 (R1-R4), photoresist formulations were prepared having the compositions (parts by mass) shown in Table 2. R1 and R3 used the sulfonated PAG bound polymers P6 and P8 above, respectively. For R2 and R4, a PAG, triphenylsulfonium nonafluorobutanesulonfate (TPS-Nf), was blended with a PHS-MCPMA copolymer. The same quencher (tetrabutylammonium lactate, TBAL) and solvents (propylene glycol monoethyl ether acetate, PGMEA, and propylene glycol monomethyl ether, PGME) were used in all of the photoresist formulations. R1 has roughly the same molar amount of PAG as in PAG blend R2, and R3 has roughly the same molar amount of PAG as in PAG blend R4.

$E_1$ is the exposure dose providing L/S pattern with a line width of 45 nm and a pitch of 100 nm; $E_2$ is the exposure dose providing L/S pattern with a line width of 55 nm and a pitch of 100 nm; $E_{op}$ is the exposure dose to size providing L/S pattern with a line width of 50 nm and a pitch of 100 nm.

Line width roughness (LWR) and line edge roughness (LER) were determined by using scanning electron microscopy (SEM) measurement of L/S pattern features (4 KeV/30 um/200 k magnification, Supra VP55, Carl Zeiss AG, Germany). Micrographs were used to calculate a critical dimension (CD), LER and LWR with Summit analysis software. The resulting standard deviation (σ) was multiplied by three (3σ) to be defined as a LWR or LER. Dark loss indicates a small amount of film loss in thickness without light exposure. $E_{size}$ is the exposure dose providing a 1:1 L/S pattern with a line width of 40 nm and generating the corresponding LWR and LER values shown in Table 3 and was calibrated on the basis of a tool factor.

The results in Table 3 demonstrate that the photoresist compositions of the present invention have favorable lithography performance such as sensitivity, LER and LWR and comparable lithography performance such as exposure latitude (EL) in positive pattern by alkaline development. Only CE2, with a higher PAG content, showed complete pattern collapse and even a dark loss. The other three photoresists were patternable and did not show any dark loss. These indicates that the PAG bound polymers of the present invention show better lithography performance than their corresponding PAG blend photoresists.

TABLE 2

| Photoresist | Resin (parts) | PAG (parts) | TBAL (parts) | PGMEA (parts) | PGME (parts) |
|---|---|---|---|---|---|
| R1 | P6 (98.5) | — | 1.5 | 2300 | 4260 |
| R2 | PHS-MCPMA (84.5) | TPS-Nf (14) | 1.5 | 2300 | 4260 |
| R3 | P8 (98.5) | — | 1.5 | 2300 | 4260 |
| R4 | PHS-MCPMA (63.5) | TPS-Nf (35) | 1.5 | 2300 | 4260 |

Examples 1 and 2 and Comparative Examples 1 and 2

For Examples 1 and 2 (E1-E2) and Comparative Examples 1 and 2 (CE1-CE2), the photoresist compositions R1 to R4 were spin-coated onto a substrate containing underlayer to form resist films having thicknesses in a range of from 40 to 42 nm with a soft-baking condition at 120° C. for 60 s. The substrates were subject to pattern exposure using an EUV interference lithography exposure tool and masks with line widths of 50, 40, 30 and 22 nm. After exposure, the substrates were subject to post exposure baking (PEB) at 120° C. for 90 s and alkaline development using TMAH (0.26 N) to develop the dense line and space (L/S) pattern, followed by de-ionized water rinse. The optimum exposure dose to clear ($E_0$, mJ/cm$^2$) was determined to evaluate the sensitivity of each resists by averaging the three smallest data points on the contrast curve. The exposure latitude (EL, %) was determined from the exposure dose which provides a dense L/S pattern with a line width of 50 nm±10% (45 nm to 55 nm) according to the following formula:

$$\text{Exposure latitude (\%)}=(|E_1-E_2|/E_{op})\times 100$$

TABLE 3

| Example | Photoresist | $E_0$ (mJ/cm$^2$) | $E_{size}$ (mJ/cm$^2$) | LWR (nm) | LER (nm) | EL (%) |
|---|---|---|---|---|---|---|
| E1 | R1 | 6.8 | 13.4 | 4.4 | 3.0 | 39.6 |
| CE1 | R2 | 5.5 | 13.4 | 8.9 | 4.8 | 50.2 |
| E2 | R3 | 4.1 | 8.5 | 6.3 | 4.0 | 31.6 |
| CE2 | R4 | 3.3 | — | — | — | — |

What is claimed is:

1. A polymer composition comprising:

0.5 to 99 mol % of a hydroxystyrene repeat unit having the formula (A):

(A)

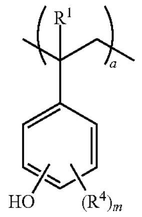

0.5 to 99 mol % of a sulfonated photoacid generator repeat unit having the formula (B):

(B)

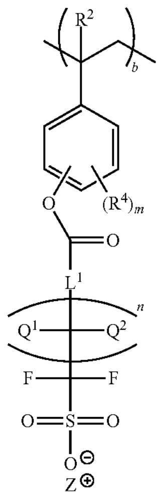

and 0.5 to 99 mol % of an acid labile repeat unit having the formula (C):

(C)

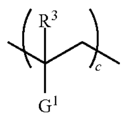

wherein:

each of $R^1$, $R^2$, and $R^3$ independently represents a hydrogen atom, an alkyl group, a cycloalkyl group, a halogen atom, a cyano group or an alkoxycarbonyl group;

$R^4$ represents a hydrogen atom, an alkyl group, an alkoxy group, a halogen atom, or a cyano group, and m represents an integer in a range of from 1 to 4, wherein when m is 2 or more, each $R^4$ independently represents a hydrogen atom, an alkyl group, an alkoxy group, a halogen atom, or a cyano group;

each of $Q^1$ and $Q^2$ independently represents a hydrogen atom, a fluorine atom or a perfluoro alkyl group with 1 to 4 carbon atoms, and n represents an integer in a range of from 0 to 4, wherein when n is 2 or more, each $Q^1$ and $Q^2$ independently represents a hydrogen atom, a fluorine atom or a perfluoro alkyl group with 1 to 4 carbon atoms;

$L^1$ represents a single bond or a divalent saturated hydrocarbon group having from 1 to 20 carbon atoms, wherein one or more methylene groups in the divalent saturated hydrocarbon group is replaced by an oxygen, a sulfur, a carbonyl group, or a sulfonyl group;

$Z^+$ represents an organic cation; and $G^1$ represents an organic group comprising an acid labile group, wherein the acid labile repeat unit having the formula (C) is derived from an acrylate having an acid-labile group in its side chain or a methacrylate having an acid-labile group in its side chain.

2. The polymer composition of claim 1, wherein the hydroxystyrene repeat unit having the formula (A) is derived from 4-hydroxystyrene.

3. The polymer composition of claim 2, wherein the sulfonated photoacid generator repeat unit having the formula (B) is given by:

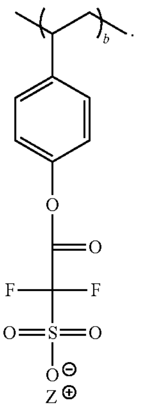

4. The polymer composition of claim 1, wherein the organic cation of $Z^+$ is selected from the group consisting of sulfonium cations and iodonium cations.

5. The polymer composition of claim 1, further comprising 0 to 98.5 mol % of a repeat unit having the formula (D) not containing an acid labile group:

(D)

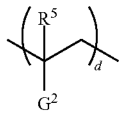

wherein:

$R^5$ represents a hydrogen atom, an alkyl group, a cycloalkyl group, a halogen atom, a cyano group or an alkoxycarbonyl group; and $G^2$ represents an organic group not containing an acid labile group.

6. The polymer composition of claim 5, wherein the repeat unit having the formula (D) not containing an acid labile group is derived from a styrene, an acrylate or a methacrylate.

7. A photoresist composition comprising the polymer composition of claim 1.

8. The photoresist composition of claim 7, wherein the photoresist composition is an EUV photoresist or a KrF photoresist.

* * * * *